United States Patent
Toyoda et al.

(10) Patent No.: US 11,543,755 B2
(45) Date of Patent: Jan. 3, 2023

(54) METHOD OF MANUFACTURING SEMICONDUCTOR DEVICE

(71) Applicant: CANON KABUSHIKI KAISHA, Tokyo (JP)

(72) Inventors: Takehiro Toyoda, Tokyo (JP); Hiroaki Kobayashi, Kanagawa (JP); Hideki Ina, Tokyo (JP); Kosuke Asano, Kanagawa (JP); Kouki Miyano, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/206,563

(22) Filed: Mar. 19, 2021

(65) Prior Publication Data
US 2021/0302842 A1 Sep. 30, 2021

(30) Foreign Application Priority Data
Mar. 27, 2020 (JP) .............................. JP2020-058312

(51) Int. Cl.
*G03F 7/20* (2006.01)

(52) U.S. Cl.
CPC .......... *G03F 7/706* (2013.01); *G03F 7/70258* (2013.01); *G03F 7/70525* (2013.01); *G03F 7/70725* (2013.01); *G03F 7/70733* (2013.01); *G03F 7/70891* (2013.01)

(58) Field of Classification Search
CPC ............. G03F 7/70525; G03F 7/70533; G03F 7/70891
See application file for complete search history.

(56) References Cited

U.S. PATENT DOCUMENTS

| | | | |
|---|---|---|---|
| 6,483,571 B1* | 11/2002 | Shiraishi | G03F 9/7015 355/71 |
| 10,157,741 B1* | 12/2018 | Lee | G03F 7/70525 |
| 10,937,673 B2 | 3/2021 | Fujimoto et al. | |

(Continued)

FOREIGN PATENT DOCUMENTS

| | | |
|---|---|---|
| EP | 0 823 662 A2 | 2/1998 |
| JP | 10-050585 A | 2/1998 |

(Continued)

OTHER PUBLICATIONS

Notice of Reasons for Refusal in Japanese Patent Application No. 2020-058312 (dated Nov. 2021).

*Primary Examiner* — Steven Whitesell Gordon
(74) *Attorney, Agent, or Firm* — Venable LLP

(57) ABSTRACT

A method of manufacturing a semiconductor device by using an exposure apparatus having a reticle stage and a projection optical system includes a first period in which substrates are exposed by using a first reticle arranged on the reticle stage, a second period in which substrates are exposed by using a second reticle arranged on the reticle stage, and a third period which is between the first and second periods. The method includes changing, in at least part of the third period, the first reticle arranged on the reticle stage to the second reticle, and performing control, in the first and second periods, to adjust temperature distribution of an optical element of the projection optical system so as to reduce change in aberration of the projection optical system. The third period is shorter than the first period.

29 Claims, 9 Drawing Sheets

(56) References Cited

U.S. PATENT DOCUMENTS

| | | | | |
|---|---|---|---|---|
| 2005/0058446 A1* | 3/2005 | Plug | .................... | G03F 7/70533 |
| | | | | 355/72 |
| 2008/0246933 A1* | 10/2008 | Uchikawa | ........... | G03F 7/70883 |
| | | | | 355/71 |
| 2009/0303483 A1 | 12/2009 | Morimoto | | |
| 2015/0370175 A1* | 12/2015 | Nicolaides | ............ | G03F 7/7085 |
| | | | | 355/77 |

FOREIGN PATENT DOCUMENTS

| | | |
|---|---|---|
| JP | 2005-019628 A | 1/2005 |
| JP | 2005-044883 A | 2/2005 |
| JP | 2006-73584 A | 3/2006 |
| JP | 2009-302154 A | 12/2009 |
| JP | 2011-048126 A | 3/2011 |
| JP | 2019-109308 A | 7/2019 |

* cited by examiner

FIG. 6B

METHOD OF MANUFACTURING SEMICONDUCTOR DEVICE

BACKGROUND OF THE INVENTION

Field of the Invention

The present invention relates to a method of manufacturing a semiconductor device.

Description of the Related Art

Japanese Patent Laid-Open No. 2006-73584 discloses an exposure apparatus that cancels, in a case in which a non-rotation symmetric aberration that occurs due to incidence of exposure light in a projection optical system has exceeded a tolerance value, the execution of an exposure operation until the non-rotation symmetric aberration becomes equal to or less than the tolerance value. Note that the characteristics of a change of an aberration generated due to incidence of exposure light in a projection optical system is generally expressed by $(1-\exp(-\Delta t/T))$. $\Delta t$ is an elapsed time from a given time, and T is a time constant. Hence, the change in the aberration generated due to the incidence of exposure light in the projection optical system tends to be large immediately after the start of an exposure operation, but will gradually saturate thereafter.

A case in which a second exposure job is to be performed by using a second reticle to expose a plurality of substrates after a first exposure job is performed by using a first reticle to expose a plurality of substrates. In this case, if enough time has elapsed before the second exposure job is to be performed after the first exposure job has ended, the aberration generated in the projection optical system by the first exposure job can be reduced. However, as can be understood from the characteristics of the change in the aberration as described above, the change of the aberration of the projection optical system that occurs immediately after the start of the second exposure job can be large if such a method is employed. Even if such an aberration is corrected each time, it can be assumed that a large change will be generated in the aberration of the projection optical system immediately after the second exposure job is started.

SUMMARY OF THE INVENTION

The present invention provides, in a case in which a plurality of substrates are to be exposed by using a second reticle after the plurality of substrates have been exposed by using a first reticle, a technique advantageous in suppressing a change in an aberration of a projection optical system during a period in which the second reticle is used to expose the plurality of substrates.

One of aspects of the present invention provides a method of manufacturing a semiconductor device by using an exposure apparatus that includes a reticle stage and a projection optical system, the method including a first period in which a plurality of substrates are exposed by using a first reticle arranged on the reticle stage, a second period in which a plurality of substrates are exposed by using a second reticle arranged on the reticle stage, and a third period which is between the first period and the second period, the method comprising: changing, in at least a part of the third period, the first reticle arranged on the reticle stage to the second reticle; and performing control, in the first period and the second period, to adjust a temperature distribution of an optical element included in the projection optical system so as to reduce a change in an aberration of the projection optical system, wherein the third period is shorter than the first period.

Further features of the present invention will become apparent from the following description of exemplary embodiments with reference to the attached drawings.

BRIEF DESCRIPTION OF THE DRAWINGS

FIG. 6B is a view exemplifying control profiles of the temperature controller in a first lot period, a first lot exchange period, and a second lot period in the first period;

DESCRIPTION OF THE EMBODIMENTS

Figure 1:
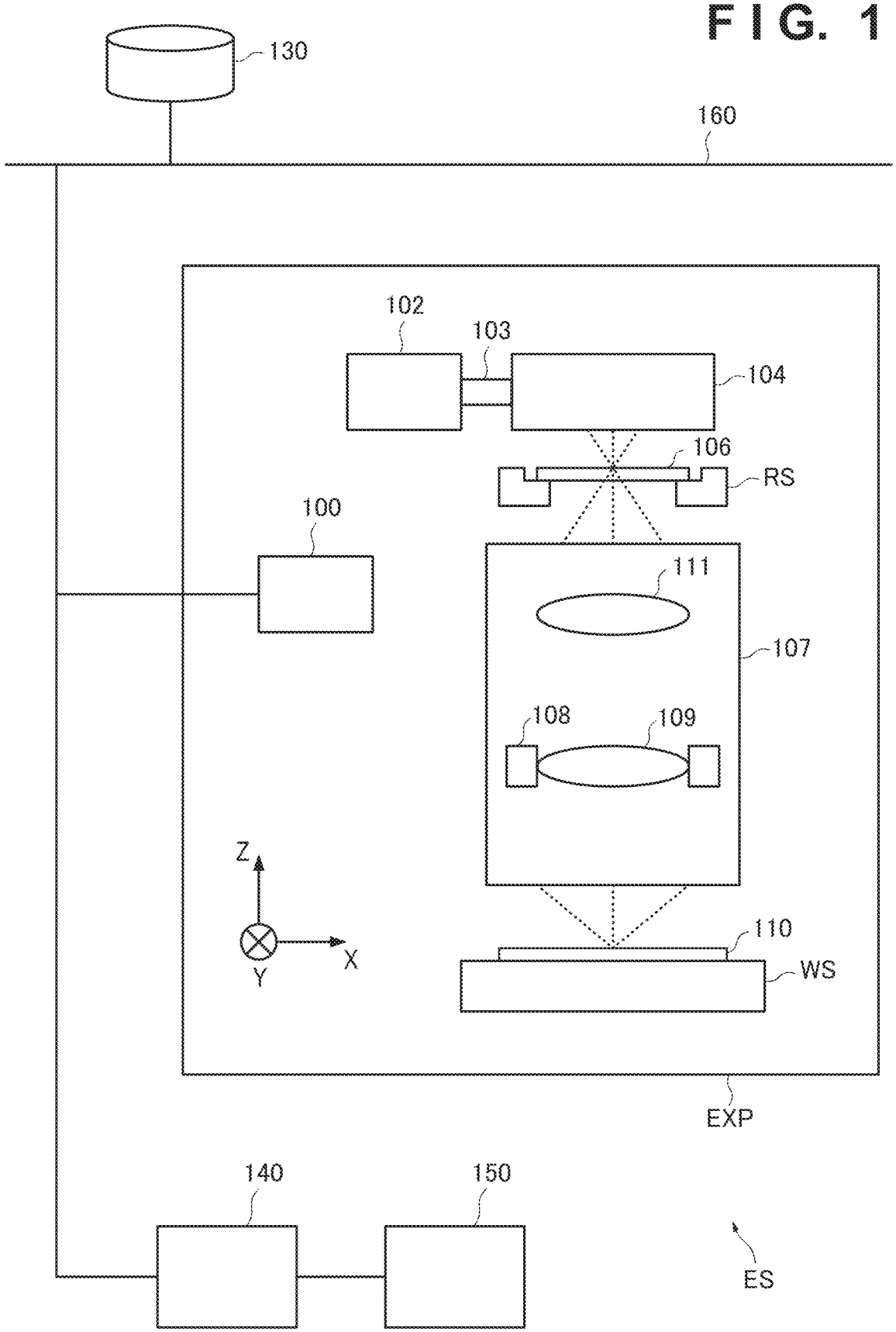
FIG. 1 is a view schematically showing the arrangement of an exposure apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

An embodiment will be described with reference to the accompanying drawings hereinafter. FIG. 1 schematically shows the arrangement of an exposure system ES which includes an exposure apparatus EX. A substrate 110 to which a photoresist has been applied by a resist application apparatus (not shown) is conveyed to the exposure apparatus EXP. The substrate 110 can typically be a wafer made of a semiconductor such as silicon or the like, it may be a substrate made of an insulator such as glass or the like or a substrate made of a conductor such as a metal or the like. In the following description, assume that the substrate 110 which is conveyed to the exposure apparatus EXP to be exposed in the exposure apparatus EXP includes a photoresist. The exposure apparatus EXP is formed as a projection exposure apparatus that includes a projection optical system 107. The exposure apparatus EXP exposes the substrate 110 by using the projection optical system 107 to project the pattern of a pattern region of a reticle 106 onto the substrate 110. This will transfer the pattern of the reticle 106 to the photoresist applied on the substrate 110. Directions will be indicated in accordance with an XYZ coordinate system in which a plane parallel to the surface on which the substrate 110 is set as the X-Y plane.

The exposure apparatus EXP can include, for example, a light source 102, an illumination optical system 104, the projection optical system 107, a reticle stage RS, a main control system 100, and the like. The light source 102 generates exposure light and supplies the generated exposure light to the illumination optical system 104. The illumination optical system 104 illuminates, in accordance with an illumination mode instructed from the main control system 100, the reticle 106 arranged on the reticle stage RS. The reticle stage RS holds the reticle 106 and is driven by a reticle stage driving mechanism (not shown). The projection optical system 107 projects the pattern of the reticle 106, arranged on an object plane, to the substrate 110, which is arranged on an image plane. The projection optical system 107 can include a plurality of optical elements including optical elements 111 and 109. The substrate stage WS holds the substrate 110 and is driven by a substrate stage driving mechanism (not shown). The main control system 100 can control the light source 102, the illumination optical system 104, the projection optical system 107, the reticle stage RS, the substrate stage WS, and the like. The main control system 100 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components.

The exposure apparatus ES can include the exposure apparatus EXP, an information server 130, a terminal server 140, and a host computer 150. The exposure apparatus EXP, the information server 130, and the terminal server 140 can connect to each other via a local area network (LAN) 160. The host computer 150 can also be connected to the LAN 160 via the terminal server 140. The main control system 100 of the exposure apparatus EXP can communicate with the host computer 150 via the LAN 160 and the terminal server 140. The terminal server 140 can be formed as a gateway processor for absorbing the difference in the communication protocol between the LAN 160 and the host computer 150. The information server 130 can be formed from a large capacity storage device and a processor. The information server 130 can receive and store information related to the reticle for the exposure layer of each of various kinds of semiconductor devices and used to cause the exposure apparatus EXP to discriminate a pattern. The information server 130 can include a mechanism for receiving and storing the reticle identification name, the reticle pattern type, the reticle transmittance, and the like for each semiconductor device product. As a result, a temperature control profile of the projection optical system 107 corresponding to the reticle pattern obtained by an experiment in advance or the like can be provided to the exposure apparatus EXP. The main control system 100 of the exposure apparatus EXP can also store the information for discriminating the reticle pattern of the exposure layer of each of these various kinds of semiconductor device. The information server 130 can store an exposure history (for example, the processed lot name, the exposure program name, the processing time, and the like) and the like transmitted from the exposure apparatus EXP. The host computer 150 can schedule, based on the exposure history, the operation of the exposure apparatus EXP in the exposure process of every lot. In addition, when instructing the exposure apparatus EXP to expose a substrate, the host computer 150 can read out the necessary correction information from the information server 130 and transmit the correction information to the main control system 100 of the exposure apparatus EXP.

The projection optical magnification of the projection optical system 107 can be, for example, 1/2, 1/3.125, 1/4, 1/5, or the like. In an exposure operation, the illumination optical system 104 illuminates the reticle 106 with the exposure light from the light source 102, and the projection optical system 107 forms a reduced image of the pattern of the reticle 106 on the substrate 110. As a result, the pattern of the reticle 106 is transferred to the photoresist applied to the substrate 110. An illumination mode setting unit that forms a light intensity distribution, according to an illumination mode selected from a plurality of illumination modes on a pupil plane of the illumination optical system 104, can be arranged in the illumination optical system 104. The illumination mode defines the light intensity distribution formed on the pupil plane of the illumination optical system 104. The plurality of illumination modes can include, for example, normal illumination (circular), small σ illumination, pole illumination (dipole, quadrupole, and the like), annular illumination, and the like. The setting or the selection of the illumination mode can be performed by, for example, rotating a turret in which a plurality of aperture stops are arranged or rotating a turret in which a plurality of CGHs (Computer-Generated Holograms) are arranged. The exposure apparatus EXP may be formed as a scanning exposure apparatus that exposes the substrate 110 while scanning the reticle 106 and the substrate 110 or formed as a stepper that exposes substrate 110 while the reticle 106 and the substrate 110 have been stopped. For the sake of a more specific example, an example in which the exposure apparatus EXP is formed as a scanning exposure apparatus will be described hereinafter.

The reticle 106 can be fixed on the reticle stage RS by, for example, vacuum chuck. The reticle stage RS can be driven, by the reticle stage driving mechanism (not shown), at a designated scanning speed in a predetermined scanning direction (Y-axis direction). A substrate chuck (not shown) is mounted on the substrate stage WS, and the substrate 110 can be fixed on the substrate chuck by, for example, a vacuum chuck. The substrate stage WS can be configured to be able to move not only in the scanning direction (Y-axis direction), but also in a non-scanning direction (X-axis direction) perpendicular to the scanning direction. The substrate stage WS can perform a step-and-scan operation in which an operation to scan and expose each shot region on the substrate 110 and an operation to move to an acceleration start position for the exposure operation of the next shot region are repeated. The substrate 110 in which all of the shot regions have been exposed will be conveyed to a developing apparatus (not shown) and developed after undergoing heating treatment or the like in the developing apparatus. As a result, a substrate on which a photoresist pattern has been formed can be obtained.

The light source 102 can include, for example, an excimer laser having a vibration wavelength of 248 nm or 193 nm. The exposure light generated by the light source 102 can be supplied to the illumination optical system 104 via a laser waveguide 103. The exposure light generated by the light source 102 may be light of another wavelength.

The projection optical system 107 can include a temperature regulator 108 that adjusts the temperature distribution of the optical element 109. A temperature regulator 108 may be arranged to be in contact with or spaced apart from the optical element 109. The temperature regulator 108 can reduce the change in the aberration of the projection optical system 107 by applying thermal energy to the optical element 109 to change the refractive index distribution and/or the surface shape of the optical element 109. For the sake of descriptive convenience, assume that the thermal energy applied to the optical element 109 by the temperature regulator 108 is a positive energy and represents heating of the optical element 109. The optical element 111 can be arranged closer to the side of the object plane (the plane on which the reticle 106 is arranged) of the projection optical system 107 than the optical element 109. The optical element 111 shown in the drawing can represent one or a plurality of optical elements. When the optical element 111 absorbs some rays of the exposure light and generates heat, the refractive index distribution and/or the surface shape of the optical element 111 will change, thereby causing the aberration of the projection optical system 107 to change.

Figure 2:
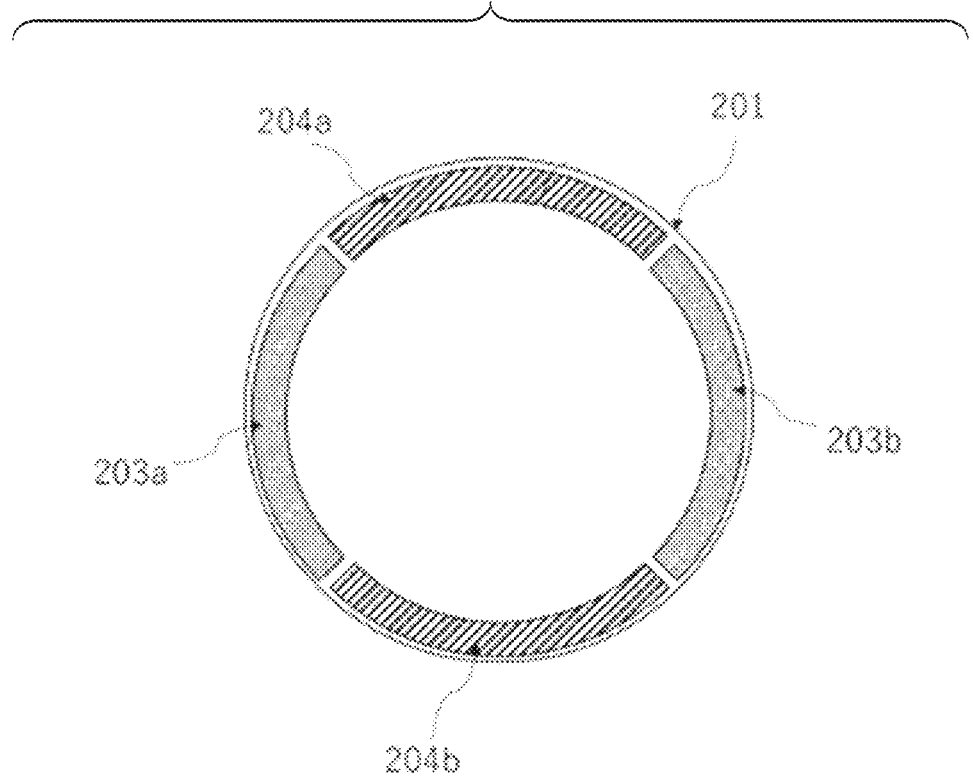
FIG. 2 is a view showing an example of the arrangement of an optical element and a temperature controller in the exposure apparatus according to the embodiment.
Figure 2:
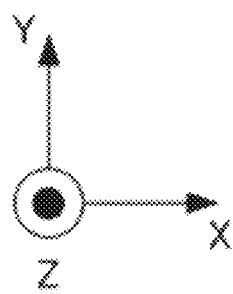

The temperature regulator 108 can include a first temperature controller that controls the temperature distribution of the optical element 109 and a second temperature controller that controls the temperature distribution of the optical element 109. FIG. 2 shows an example of the arrangement of the temperature regulator 108. The optical element 109 shown in FIG. 2 can represent one or a plurality of optical elements. The optical element 109 can include, for example, a lens, but may include a mirror. A first temperature controller 204 can include heating elements 204a and 204b. A second temperature controller 203 can include heating elements 203a and 203b. Each of the heating elements 204a, 204b, 203a, and 203b can be, for example, a heating element that can generate heat when a current is supplied and can use the heat to form a temperature distribution on the optical element 109. Each of the heating elements 204a, 204b, 203a, and 203b can be, for example, a thermoelectric element that includes a heat generating resistor that generates heat by Joule heating. Unless otherwise mentioned, each of the heating elements 204a, 204b, 203a, and 203b will be described to be a heat generating resistor hereinafter. However, each of the heating elements 204a, 204b, 203a, and 203b may be another type of thermoelectric element, for example, a Peltier element or the like.

The first temperature controller 204 and the second temperature controller 203 of the temperature regulator 108 can change the thermal energy applied to the optical element 109 of the projection optical system 107 in an exposure time from that applied in a non-exposure time. The manufacturing process of a semiconductor device can require, for example, several tens or more of exposure layers. In general, there are characteristic differences between the main pattern shapes, the aperture ratios (each aperture ratio is an area ratio of a transparent region to a blocking region with respect to exposure light in a pattern region), and the like of the plurality reticles used for the plurality of exposure layers. The diffracted light distribution on the projection optical system 107 corresponding to the reticle pattern can generate a temperature distribution on the optical element forming the projection optical system 107, thereby causing astigmatism to be generated in the projection optical system 107.

Figure 7:
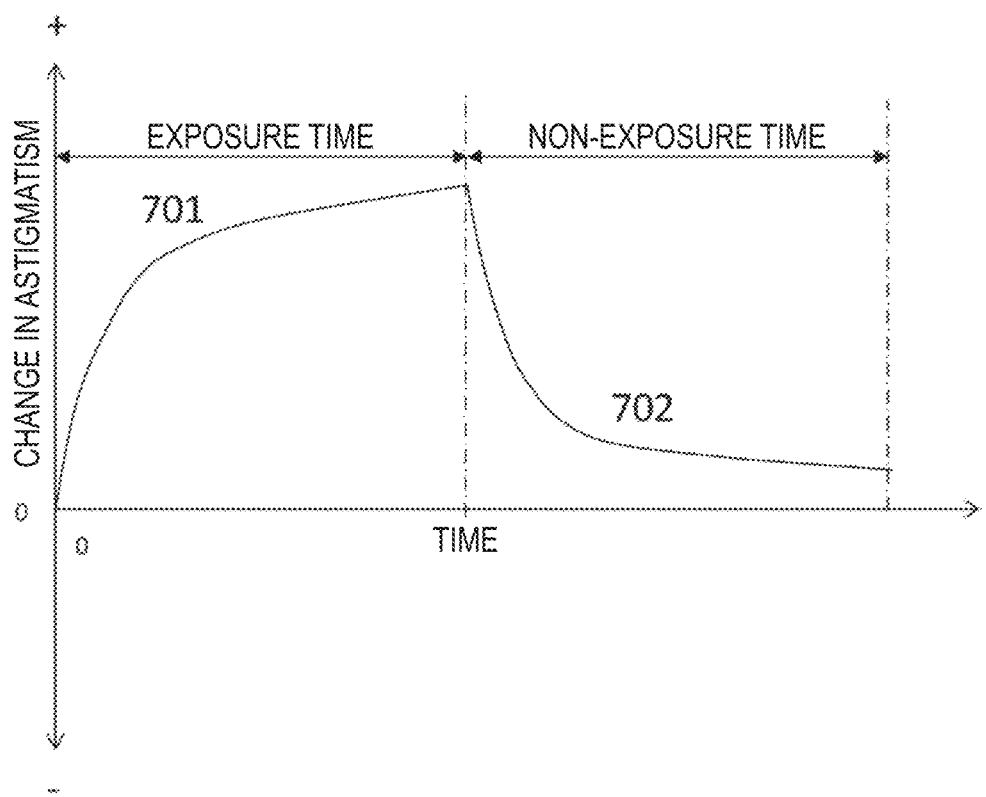
FIG. 7 is a graph for explaining a change in astigmatism of the projection optical system of the exposure apparatus.

FIG. 7 shows an example of a change (note that in this embodiment, unless otherwise mentioned, a change will mean a change in accordance with the elapse of time) in the astigmatism of the projection optical system 107 of the exposure apparatus EXP. An "exposure time" indicates an exposure operation period including a plurality of exposure operations, and a "non-exposure time" indicates a non-exposure operation period in which exposure operations are not continuously executed. A curve 701 shows a change in the astigmatism of the projection optical system 107 during the exposure time. When the start of the exposure operation period and the end of the exposure operation period are compared, it can be seen that the change in the astigmatism is smaller for the latter. A curve 702 shows a change in the astigmatism of the projection optical system 107 during the non-exposure time, and the astigmatism changes when an optical element (for example, the optical element 111) of the projection optical system 107 is deformed due to heat dissipation from the optical element. For the astigmatism of the projection optical system 107 to return to the same degree of astigmatism as that at the point of the start of the final exposure operation period from this reduction in the temperature of the optical element of the projection optical system 107 due to heat dissipation, approximately the same amount of time as the final exposure operation period will be required.

Hence, the throughput can greatly degrade if there is a requirement to wait for approximately the same amount of time as the exposure operation period from the end of the final exposure operation period. In addition, if the next exposure operation is started after such a wait, the change in the astigmatism will be large in the initial period of this exposure operation period. As a result, it will be harder to cancel this change by using the temperature regulator 108. The embodiment to be described below attempts to minimize this kind of disadvantage by reducing the length of a period (a third period to be described below) from the end of the final exposure operation period until the next exposure operation period is started.

Figure 3A:
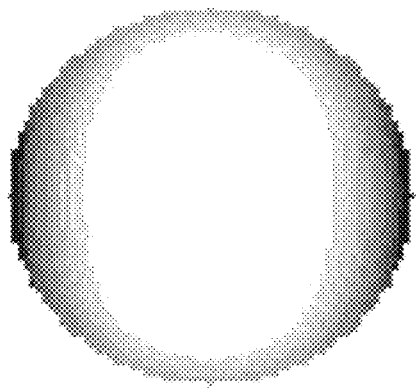
FIGS. 3A and 3B each are a view showing a temperature distribution on the optical element that has been heated by the temperature controller in the exposure apparatus according to the embodiment.
Figure 3B:
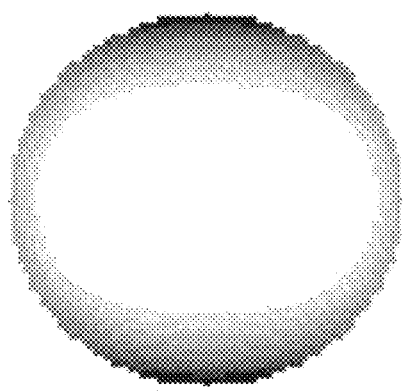

FIG. 3A shows an example of the temperature distribution on the optical element 109 which has been heated by the second temperature controller 203. At this time, astigmatism is generated in the positive direction on the surface of the substrate 110. FIG. 3B shows an example of the temperature distribution of the optical element 109 heated by the first temperature controller 204. The temperature distribution of FIG. 3B is a temperature distribution of an opposite phase to the temperature distribution of FIG. 3A, and astigmatism is generated in the negative direction on the surface of the substrate 110. In this manner, the heating of the optical element 109 by the first temperature controller 204 and the second temperature controller 203 can generate positive astigmatism and negative astigmatism on the surface of the substrate 110.

Figure 4:
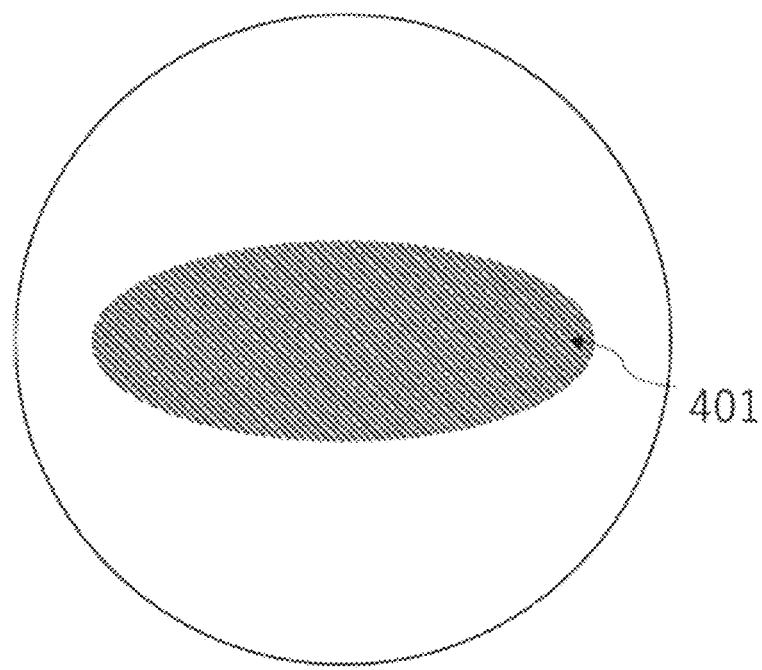
FIG. 4 is a view exemplifying the distribution of exposure light that is passed through an optical element of a projection optical system of a scanning exposure apparatus.
Figure 4:
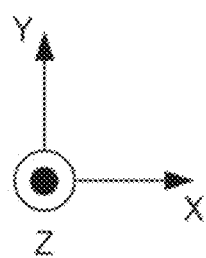

Consider a case in which the exposure apparatus EXP is applied to a scanning exposure apparatus that scans the reticle 106 and the substrate 110 to a slit shaped exposure light beam extending in the X direction. In this case, the intensity distribution of the exposure light beam passing the optical element 111, which is near the reticle 106, of the plurality of optical elements of the projection optical system 107 at the exposure time can be as shown in a hatched portion 401 of FIG. 4. Hence, the temperature distribution on the optical element 111 will differ in the X direction and the Y direction due to the optical element 111 absorbing the exposure light, and this difference can cause the astigmatism of the projection optical system 107 to increase. Hence, the first temperature controller 204 can apply a temperature distribution on the optical element 109 so as to reduce this astigmatism. In the projection optical system 107, the optical element 109 can be arranged between the optical element 111 and an optical element, which is closest to the side of the image plane, among the plurality of optical elements forming the projection optical system 107. For example, the optical element 109 may be arranged on or near the pupil of the projection optical system 107 or may be arranged closer to the side of the image plane of the projection optical system 107 than the pupil. The positive and negative signs of the astigmatism generated in the projection optical system 107 by the application of thermal energy to the optical element 109 by the first temperature controller 204 are the opposite of positive and negative signs of the astigmatism generated in the projection optical system 107 by absorption of the exposure light by the optical element 111. Hence, the overall astigmatism of the projection optical system 107 can be reduced by the astigmatism generated in the projection optical system 107 by the application of thermal energy to the optical element 109 by the first temperature controller 204.

Consider a case in which the host computer 150 manages the execution schedule of each lot to use the exposure apparatus EXP to continuously expose m lots (m≥2) for an exposure layer A and thereafter continuously expose n lots (n≥2) for an exposure layer B. The exposure layer A is an exposure layer for forming word lines of a memory cell such as a DRAM or the like of a semiconductor storage element, and two arbitrary continuous lots of the m lots will be defined as a first lot and a second lot. Also, the exposure layer B is an exposure layer for forming bit lines of the memory cell, and two arbitrary continuous lots of the n lots will be defined as a third lot and a fourth lot.

In this example, in both the exposure layer A forming the word lines and the exposure layer B forming the bit lines, assume that the illumination mode will be set to normal illumination (circular illumination). A substrate cassette generally used in the manufacturing process of a semiconductor device can store 25 substrates, and a single lot tends to be formed by 25 substrates. After the exposure of the exposure layer A is performed on the substrate 110 to which a photoresist has been applied by the resist application apparatus (not shown), a photoresist pattern of the word lines can be formed by developing the substrate 110 by the developing apparatus (not shown). Etching can be performed by using the photoresist pattern as a mask, and the photoresist can be subsequently removed by ashing or a process using a stripping solution. As a result, a trench pattern of the word lines can be fabricated on the upper most layer of an interlayer insulation film layer or the like on the substrate 110. Thereafter, by using one or a combination of a deposition apparatus, a sputtering apparatus, a plating apparatus, and the like (all not shown), a film made of a material forming the word lines is deposited on the substrate 110 and embedded in the aforementioned trench pattern. Subsequently, a planarization process can be performed by using one or a combination of a CMP (Chemical Mechanical Polishing) apparatus, an etching apparatus, and the like. By undergoing such semiconductor manufacturing processes, word lines made of a desired constituent material can be formed on the uppermost surface of the interlayer insulation film layer or the like of the substrate 110. The formation method of the bit lines can be similar to the formation method of the word lines.

Figure 5A:
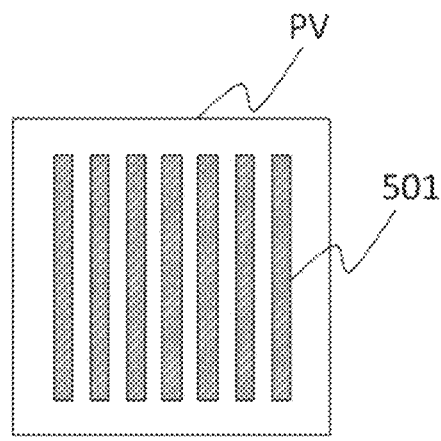
FIGS. 5A to 5F are views exemplifying the differences in diffracted light distributions and temperature distributions on the projection optical system due to a reticle pattern.
Figure 5B:
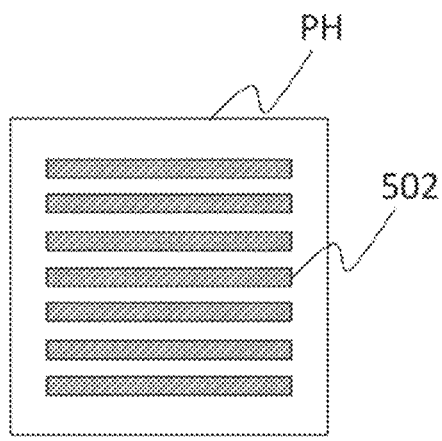

FIG. 5A shows an example of a reticle for forming word lines. The reticle for forming the word lines includes a line-and-space pattern PV formed of lines and spaces which are arrayed in the X direction in parallel to the Y direction. A line-and-space pattern will be referred to as an LS pattern hereinafter. FIG. 5B shows an example of a reticle for forming bit lines. The reticle for forming the bit lines includes an LS pattern PH formed of lines and spaces arrayed in the Y direction in parallel to the X direction. A hatched portion 501 in FIG. 5A and a hatched portion 502 in FIG. 5B represent transparent regions that transmit exposure light and portions other than these transparent regions represent blocking regions that block the exposure light. Assume that the aperture ratio (the area ratio of the transparent region to the blocking region with respect to the exposure light) in the pattern region of the reticle shown in FIG. 5A and that of FIG. 5B are approximately equal.

Figure 5C:
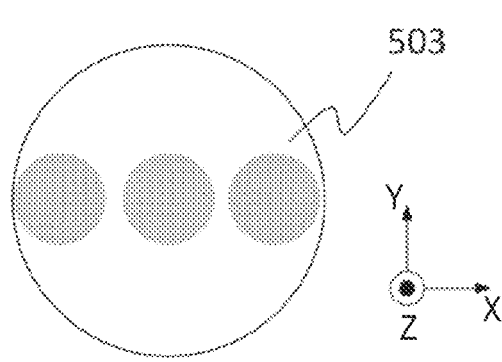
Figure 5D:
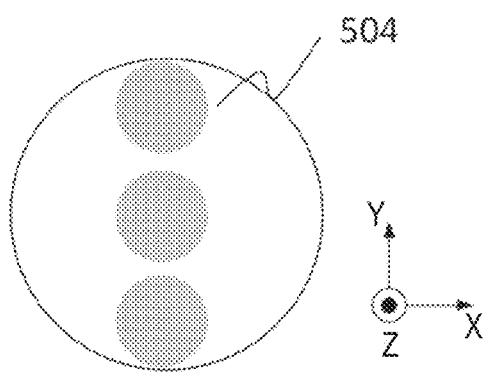

In a case in which the LS pattern PV is formed at a pitch near the limit of the resolution in which all of the first-order diffracted light beams of the projection optical system 107 in the normal illumination will be used to form an image, a diffracted light distribution as exemplified by a hatched portion 503 of FIG. 5C will be generated near the pupil plane of the projection optical system 107. The diffracted light distribution of FIG. 5C can include three pole regions (negative first-order light, zeroth-order light, and positive first-order light) aligned in the X direction (non-scanning direction). On the other hand, in a case in which the LS pattern PH is formed at a pitch near the limit of the resolution of the projection optical system 107 in the normal illumination, a diffracted light distribution exemplified by a hatched portion 504 of FIG. 5D will be generated near the pupil plane of the projection optical system 107. The diffracted light distribution of FIG. 5D can include three pole regions (negative first-order light, zeroth-order light, and positive first-order light) aligned in the Y direction (scanning direction).

Figure 5E:
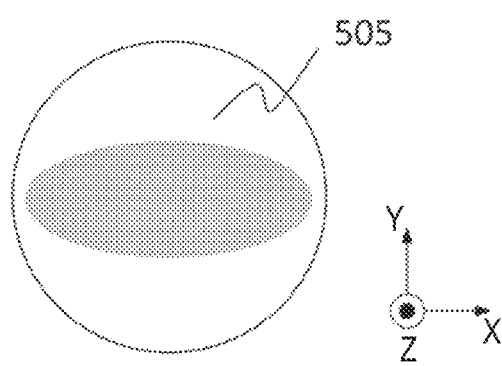
Figure 5F:
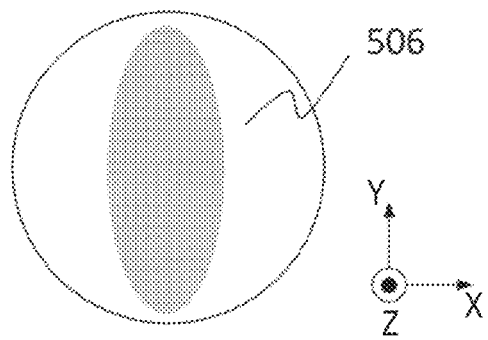

The diffracted light distributions as described above can generate temperature distributions as shown in a hatched portion 505 of FIG. 5E and a hatched portion 506 of FIG. 5F, respectively, on the optical element 109 arranged on or near the pupil plane of the projection optical system 107. As is obvious from a comparison of FIGS. 3A and 3B, the LS pattern PV can cause positive astigmatism to be generated in the projection optical system 107, and the LS pattern PH can cause negative astigmatism to be generated in the projection optical system 107.

The astigmatism does not degrade the resolution performance itself of the LS pattern, but can cause the resolution performance to degrade by causing the pattern extending in a direction perpendicular to the LS pattern to become defocused. This will be simply described with an example. Although the main pattern among the patterns of the reticle for the word lines is the LS pattern PV arrayed in the X direction, the reticle may include another LS pattern arrayed in the Y direction. In this case, the exposure light that passed through the LS pattern PV arrayed in the X direction will be diffracted in the X direction, and the exposure light that passed through the other LS pattern arrayed in the Y direction will be diffracted in the Y direction. In a state in which positive astigmatism is generated in the projection optical system 107 by mainly the LS pattern arrayed in the X direction, the plane on which the image of the LS pattern PV arrayed in the X direction is formed will be different from the plane on which the image of the other LS pattern arrayed in the Y direction is formed. Hence, when the substrate surface is positioned on the plane on which the image of the LS pattern PV which is the main pattern of the reticle 106 is formed, the image of the other LS pattern arrayed in the Y direction will become defocused.

With consideration to the above description, assume a state in which positive astigmatism has been generated in the projection optical system 107 by performing an exposure operation using a word line reticle in which the LS pattern PV arrayed in the X direction is the main pattern. When an exposure operation using a bit line reticle in which the LS pattern PH arrayed in the Y direction is the main pattern is performed, this exposure operation can be an exposure operation in which a blurred image which has shifted from a suitable focus will be formed. This is because the suitable focus to be applied to the exposure operation using the bit line reticle, in which the LS pattern PH arrayed in the Y direction is the main pattern, needs to be determined under a condition in which positive astigmatism is not generated in the projection optical system 107.

Figure 8A:
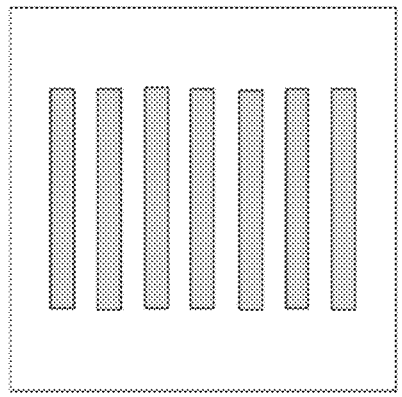
FIGS. 8A and 8B are views exemplifying OPC correction of the reticle pattern.
Figure 8B:
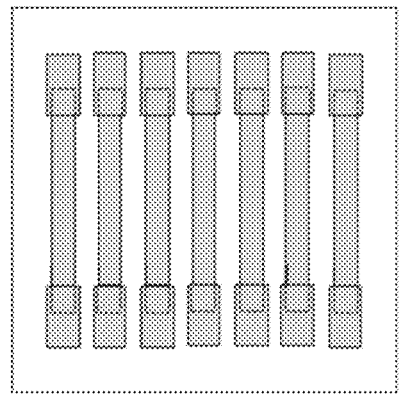

In accordance with the reduction in the design rules of semiconductor devices, an optical proximity effect in which a desired pattern cannot be formed on a substrate due to the effect of interference, refraction, scattering, and the like of the exposure light has become a problem. More specifically, phenomena such as the shifting of the edge position, pattern corner rounding, line end shortening, pattern disconnection, pattern connection, insufficient coverage of a via, and the like may occur, and a desired performance may not be implemented. To correct pattern deformation caused by such an optical proximity effect, OPC (Optical Proximity Effect Correction) that allows a desired shape to be obtained on a substrate by correcting the pattern of a reticle can be employed. OPC is particularly effective in a case in which a design pattern close to the limit of the resolution is to be transferred in an exposure apparatus that uses a KrF or an ArF excimer laser beam as the exposure light. However, astigmatism can reduce the effect of the OPC performed on the pattern of the reticle to correct the optical proximity effect. For example, consider a case in which a line end correction pattern is formed on the end portion of the LS pattern PV, arrayed in the X direction on the word line reticle, to suppress the generation of line end shortening. FIG. 8A shows the pattern of the reticle with the design before the correction, and FIG. 8B shows the pattern of the reticle obtained after the line end correction pattern has been added. In the word line reticle, the LS pattern PV arrayed in the X direction is the main pattern. The exposure light that has passed through the LS pattern PV will be diffracted in the X direction and cause positive astigmatism to be generated in the projection optical system 107. Hence, if the suitable focus position is determined by paying attention to the LS pattern PV, the line end correction pattern added to the end of each line extending in the Y direction will become defocused by the influence of the astigmatism of the projection optical system 107, and the desired line end correction effect will not be obtained.

Since the sign of the astigmatism to be generated by using the optical element 109 on or near the pupil plane of the projection optical system 107 of the word line reticle is the opposite of that of the bit line reticle, the operation of the temperature regulator 108 will be different for each reticle. For example, in a period in which the exposure operation is performed for the word lines, positive astigmatism will be generated in the projection optical system 107 by the temperature distribution due to the diffracted light distribution by the LS pattern PV of the reticle. Hence, in this period, control can be performed to heat the heating elements 204a and 204b forming the first temperature controller 204 to add negative astigmatism to the astigmatism of the projection optical system 107. On the other hand, in a period in which the exposure operation is performed for the bit lines, negative astigmatism will be generated in the projection optical system 107 by the temperature distribution due to the diffracted light distribution by the LS pattern PH of the reticle. Hence, in this period, control can be performed to heat the heating elements 203a and 203b forming the second temperature controller 203 to add positive astigmatism to the astigmatism of the projection optical system 107.

Here, assume that a first reticle is a reticle to be used in the exposure of an exposure layer for forming the word lines, and a second reticle is a reticle to be used in the exposure of an exposure layer for forming the bit lines. Also, assume that a first period is a period for exposing a plurality of substrates by using the first reticle arranged on the reticle stage RS, a second period is a period for exposing a plurality of substrates by using the second reticle arranged on the reticle stage RS, and a third period is a period between the first period and the second period. In at least a part of the third period, the first reticle arranged on the reticle stage RS will be changed to the second reticle.

Assume that a first lot and a second lot are two arbitrary continuous lots among m (m≥2) lots which are to undergo the exposure process in the first period. Also, assume that a first lot period is a period from the start of the exposure of a first shot region of a first substrate to a final shot region of a final substrate of a plurality of substrates forming the first lot which is to undergo an exposure process by using the first reticle. Also, assume that a second lot period is a period from the start of the exposure of a first shot region of a first substrate to a final shot region of a final substrate of a plurality of substrates forming the second lot which is to undergo an exposure process by using the first reticle. The first period can be, for example, a period of 40 min or longer, 50 min or longer, or 60 min or longer. Although the first period does not have an upper limit, the first period can be, for example, a period no longer than 100 min. For example, 50 substrates or more, 100 substrates or more, 150 substrates or more, or 200 substrates or more can be exposed in the first period. For example, not more than 300 substrates can be exposed in the first period.

In a similar manner, assume that a third lot and a fourth lot are two arbitrary continuous lots among n (n≥2) lots which are to undergo the exposure process in the second period. Also, assume that a third lot period is a period from the start of the exposure of a first shot region of a first substrate to a final shot region of a final substrate of a plurality of substrates forming the third lot which is to undergo an exposure process by using the second reticle. Also, assume that a fourth lot period is a period from the start of the exposure of a first shot region of a first substrate to a final shot region of a final substrate of a plurality of substrates forming the fourth lot which is to undergo an exposure process by using the second reticle. The second period can be, for example, a period of 40 min or longer, 50 min or longer, or 60 min or longer. Although the second period does not have an upper limit, the second period can be, for example, a period no longer than 100 min. For example, 50 substrates or more, 100 substrates or more, 150 substrates or more, or 200 substrates or more can be exposed in the second period. For example, not more than 300 substrates can be exposed in the second period.

Figure 6A:
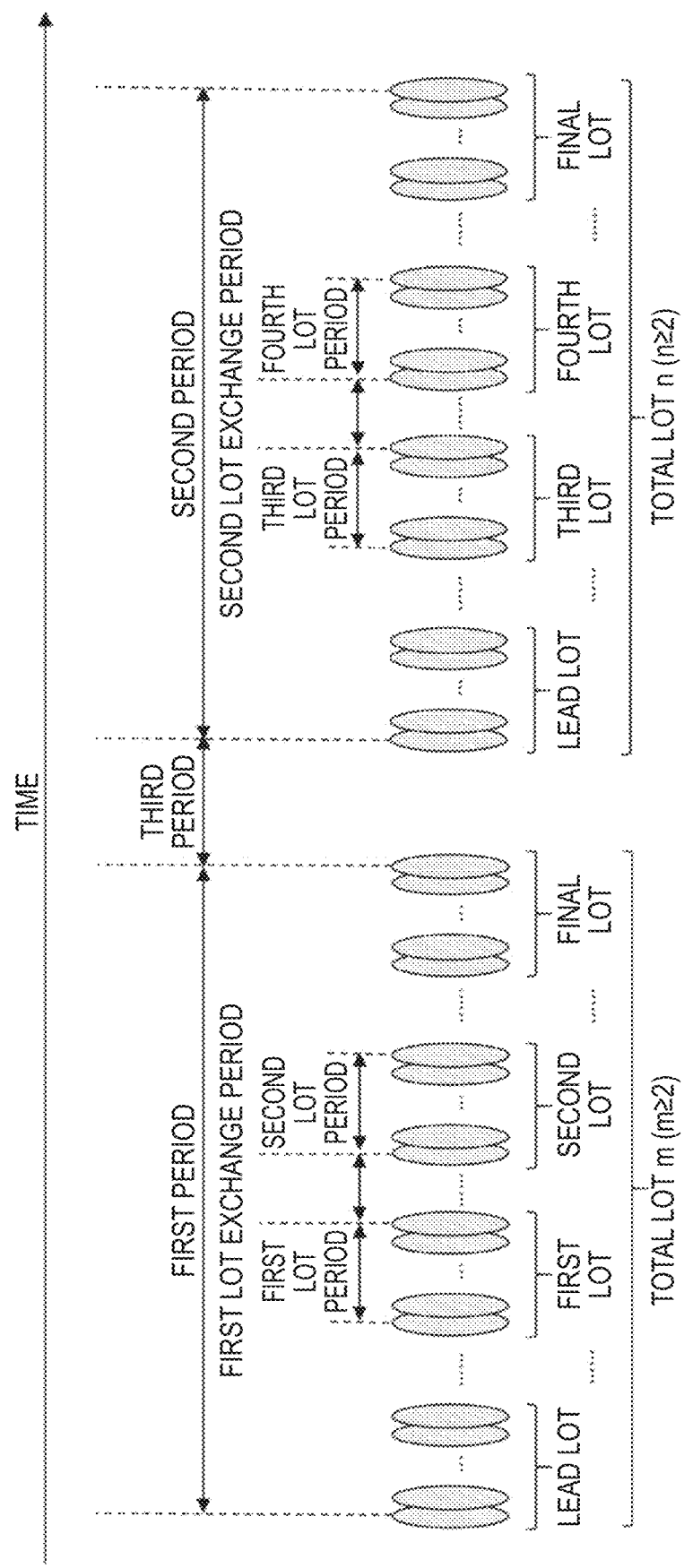
FIG. 6A is a view for explaining a first period, a second period, and a third period.

Furthermore, assume that a first lot exchange period is a first intermediate period which is a period between the first lot period and the second lot period, and a second lot exchange period is a second intermediate period which is a period between the third lot period and the fourth lot period. The various kinds of periods described above are exemplified in FIG. 6A.

The third period can be a period shorter than the first period. The third period can be shorter than the period from the start of the first lot period to the end of the second lot period. Alternatively, the third period can be shorter than the second lot period. The length of the third period can be, for example, 10 min or shorter, 20 min or shorter, or 30 min or shorter. The lower limit of the third period can be a finite time longer than 0 sec. The lower limit of the third period can be 1 sec for the sake of convenience, but may be for example, 10 sec, 20 sec, or 30 sec. The lower limit of the third period can be the time required to change the reticle arranged on the reticle stage RS. The length of the third period may be 1 min or longer, 2 min or longer, 3 min or longer, 4 min or longer, or 5 min or longer, and may be 10 min or longer. The period from the end of the exposure of the final shot region of the final substrate of the first period until the start of the first shot region of the first substrate of the second period can be, for example, 2 min or shorter. The third period can be longer than the time from the start of the exposure of the first shot region to the end of the exposure of the final shot region of one substrate of the plurality of substrates exposed in the first period. Alternatively, the third period may be longer than the first lot exchange period which is the first intermediate period.

In the first lot exchange period in which the first lot is switched to the second lot in the first period, alignment (reticle alignment) of the first reticle on the reticle stage RS, the focus measurement of the projection optical system 107 and an alignment optical system (not shown), and the like can be performed. Similar operations can be performed in the second lot exchange period in which the third lot is switched to the fourth lot in the second period.

The start timing of the third period, in which the first reticle is exchanged with the second reticle, can be the end timing of the exposure operation of the final shot region of the final substrate of the final lot to undergo the exposure process in the first period, in which processing is performed by using the first reticle. Also, the end timing of the third period can be the start timing of the first shot region of the first substrate of the first lot to undergo the exposure process in the second period, in which processing is performed by using the second reticle. In the third period, the alignment (reticle alignment) of the second reticle on the reticle stage RS and the focus measurement of the projection optical system and the alignment optical system can be performed in a manner similar to those performed in the first lot exchange period and the second lot exchange period. Also, the exchange from the first reticle to the second reticle, a scanning operation (adjustment operation) for the purpose of adjusting the magnification or the like of the reticle newly mounted on the reticle stage RS, various kinds of calibration operations can be performed in the third period. In addition, the alignment of the substrate on the substrate stage WS and an operation to align the reticle and the substrate can be performed in the third period.

Figure 6B:
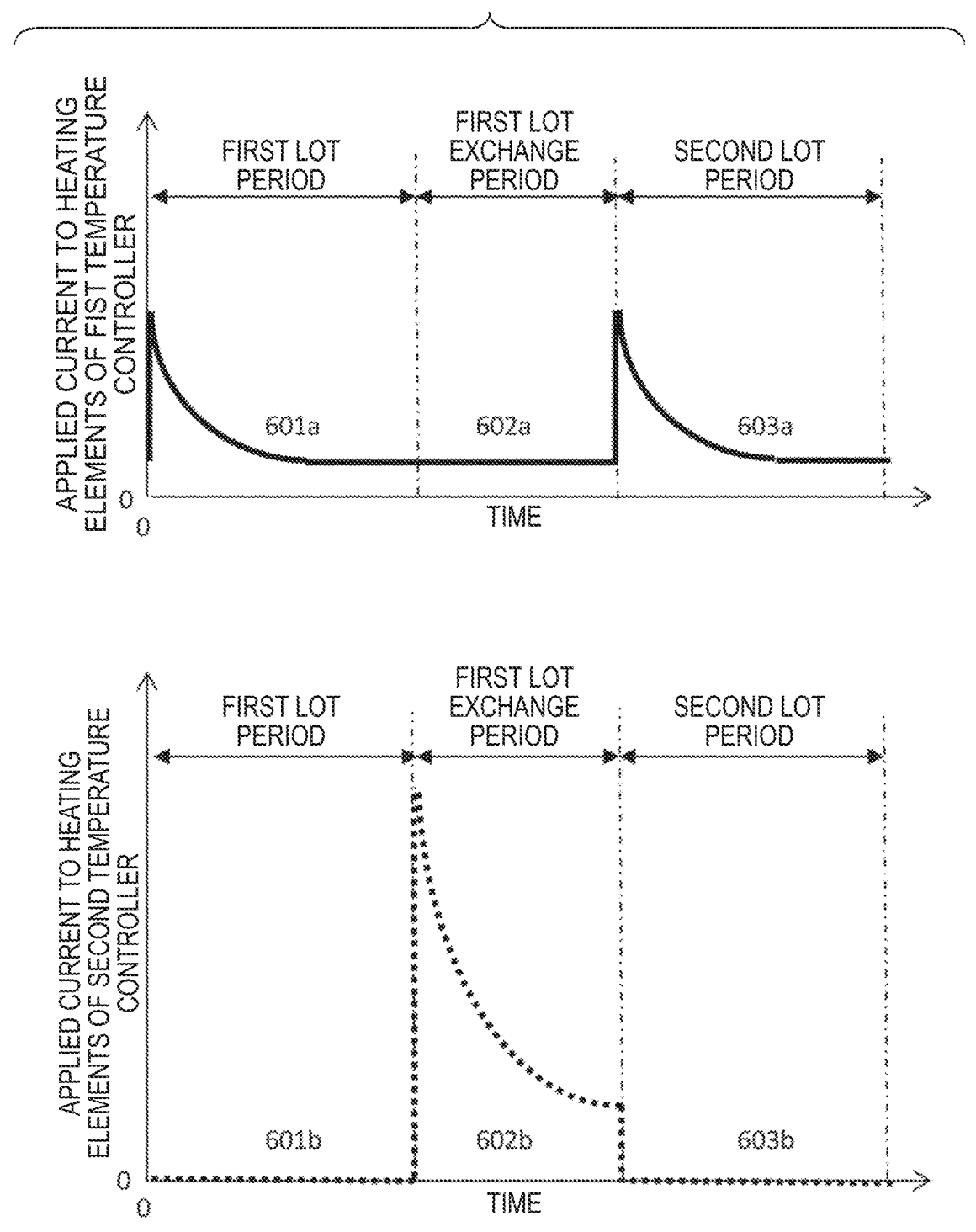

FIG. 6B shows a control example of current application performed to each heating element of the first temperature controller 204 and each heating element of the second temperature controller 203 in the first lot period, the second lot period, and the first lot exchange period in which the first reticle is used. First, the first lot period will be described. As described above, due to the slit-shaped exposure light extending in the X direction during the time of exposure, the light intensity distribution on the optical element 111, which is near the reticle, in the projection optical system 107 becomes as that shown in the hatched portion 401 of FIG. 4, and positive astigmatism can be generated in the projection optical system 107. Also, the main pattern of the first reticle is the LS pattern PV arrayed in the X direction, and a diffracted light distribution as shown in the hatched portion 503 of FIG. 5C is generated on or near the pupil plane of the projection optical system 107. As a result, a temperature distribution, as shown in the hatched portion 505 of FIG. 5E, is generated on the optical element 109 arranged on or near the pupil plane of the projection optical system 107, and this temperature distribution can cause positive astigmatism to be generated in the projection optical system 107.

The main control system 100 can control the thermal energy applied to the optical element 109 by the first temperature controller 204 and the second temperature controller 203. FIG. 6B shows an example of a current 601a applied to the heating elements 204a and 204b of the first temperature controller 204 and a current 601b applied to the heating elements 203a and 203b of the second temperature controller 203. In the first lot period, the current is applied to the heating elements 204a and 204b of the first temperature controller 204, but the current is not applied to the heating elements 203a and 203b of the second temperature controller 203. Since positive astigmatism can be generated in the projection optical system 107 during the first period in which the first reticle is used as described above, negative astigmatism needs to be generated to suppress the change in the astigmatism. The main control system 100 can make the change in the astigmatism of the projection optical system 107, which is generated by heating by the current 601a applied to the heating elements 204a and 204b of the first temperature controller 204, follow the change in the astigmatism of the projection optical system 107 generated by the absorption of the exposure light. This can be implemented by causing the main control system 100 to gradually reduce the current 601a from a predetermined value in accordance with the elapse of time from the start of the first lot period.

Although the temperature distribution of the optical element 109 can be controlled to be uniform by the first temperature controller 204 and the second temperature controller 203, the object is not the uniform control of the temperature distribution of the optical element 109. This is because the correction target is not the astigmatism of the optical element 109, but the astigmatism of the projection optical system 107. Hence, the first temperature controller 204 and the second temperature controller 203 need only generate a temperature distribution on the optical element 109 so as to reduce the change in the astigmatism of the projection optical system 107.

The control performed in the application of a current to each heating element of the first temperature controller 204 and each heating element of the second temperature controller 203 in the first lot exchange period, which is between the first lot period and the second lot period, of the first period in which the first reticle is used will be described next. In the first lot exchange period in which the projection optical system 107 is not irradiated with the exposure light, the heat dissipation from the optical element 109 of the projection optical system 107 can start and cause the temperature of the optical element 109 to decrease. Hence, both the first temperature controller 204 and the second temperature controller 203 are controlled so as to minimize, as much as possible, the change in the temperature distribution of the optical element 109 that occurs immediately after the end of the first period. For example, a current, such as a current 602a, of approximately the same magnitude as that at the time of the end of the first lot period can continue to be applied to the heating elements 204a and 204b of the first temperature controller 204. To compensate the heat from the exposure light absorbed by the optical element 109 in the first lot period, the application of a current, such as a current 602b, can be started to the heating elements 203a and 203b of the second temperature controller 203 from the start of the first lot exchange period. The main control system 100 can gradually decrease the current 602b applied to the heating elements 203a and 203b of the second temperature controller 203 in accordance with the elapse of time from the start of the first lot exchange period. As a result, it will be possible to suppress, while suppressing the change in the temperature distribution of the optical element 109, the change in the astigmatism of the projection optical system 107 that can be generated by heating of the optical element 109 by the heating elements 204a, 204b, 203a, and 203b. To suppress the heat dissipation and the change in the astigmatism that accompanies the heat dissipation, due to the lack of exposure light irradiation, in each optical element of the projection optical system 107, it is preferable to set the first lot exchange period to be as short as possible.

The control performed in the application of a current to each heating element of the first temperature controller 204 and each heating element of the second temperature controller 203 in the second lot period after the first lot exchange period in the first period in which the first reticle is used will be described. Since the absorption of the exposure light by the optical element 109 of the projection optical system 107 will be restarted immediately after the start of the second lot period, the application of the current to the heating elements 203a and 203b of the second temperature controller 203 performed in the first lot exchange period will be stopped as shown by a current 603b. On the other hand, in a manner similar to the first lot period, a temperature distribution that can cause the generation of positive astigmatism in the projection optical system 107, due to the influence of a diffracted light distribution in the X direction which depends on the pattern of the reticle, can be generated from the start of the second lot period. Hence, to generate astigmatism in the opposite direction, a current 603a is applied to the heating elements 204a and 204b of the first temperature controller 204 from the start of the second lot period. The main control system 100 can gradually reduce the current 603a applied to the heating elements 204a and 204b of the first temperature controller 204 in accordance with the elapse of time from the start of the second lot period. The control performed to apply the current to each heating element of the first temperature controller 204 and each heating element of the second temperature controller 203 in the second lot period can be similar to that performed in the first lot period. The difference in the control operations performed concerning the temperature control applied to the optical element 109 between the two periods can be determined based on the point of view related to the method of current application to the first temperature controller 204 and the second temperature controller 203 and the magnitude relationship and the size of the difference in the amount of heat applied by the first temperature controller 204 and the second temperature controller 203. The difference in the current application method can be determined based on the difference between profiles showing the relationship between the elapsed time and the current value, as exemplified in FIG. 6B, for example, a method in which a constant current value is applied, whether to increase or decrease the current value in accordance with the elapsed time, or the like.

According to the above method, even in a case in which an exposure operation is continuously performed on over 100 substrates by using the same reticle by repeating a lot period and a lot exchange period, exposure can be performed while suppressing a change in the astigmatism of the projection optical system. Note that 100 substrates correspond to 4 lots in a case in which 25, which is the maximum number of substrates that can be stored in a normal substrate cassette, is set as a single lot.

The profile of a current applied to the heating elements of the first temperature controller 204 and that of a current applied to the heating elements of the second temperature controller 203 can be determined based on an experiment performed to obtain the relationship between the current value and the measured value of the astigmatism. For example, there is a method in which a current can be applied to each heating element of the first temperature controller 204 and the second temperature controller 203, the change in the aberration of the projection optical system 107 while the optical element 109 is heated by applying a current to each heating element of the first temperature controller 204 and each heating element of the second temperature controller 203 can be measured, and each parameter can be determined based on the result. According to this method, each parameter can be determined by including the change in the aberration that can be generated due to thermal conduction and thermal radiation to a lens barrel of the projection optical system 107, thereby allowing the profile of the current to be determined highly accurately.

Figure 6C:
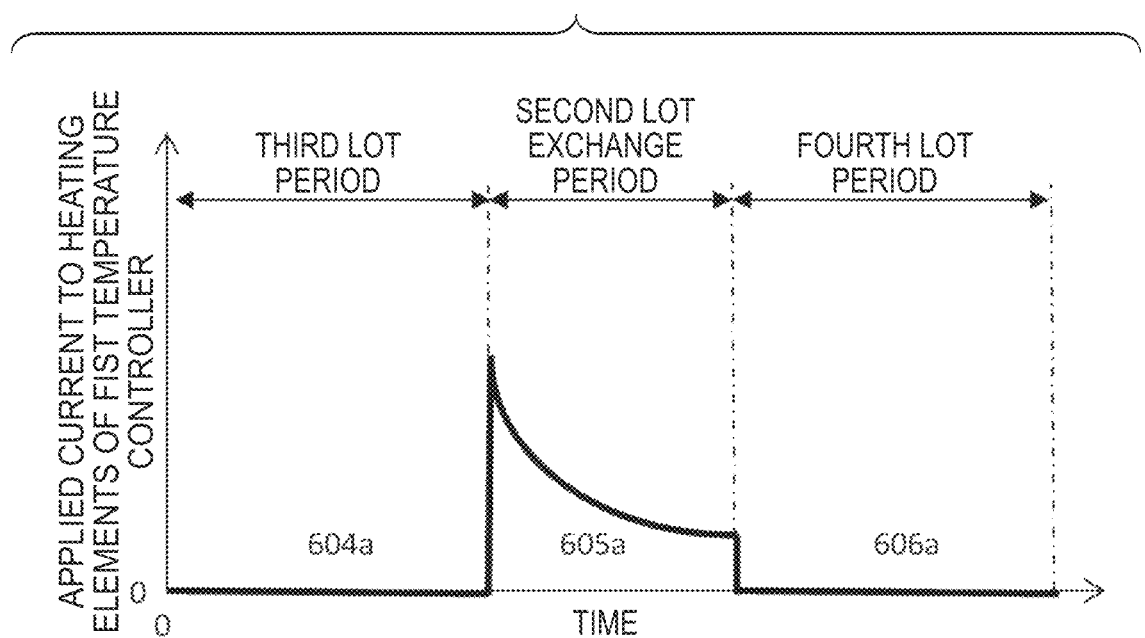
FIG. 6C is a view exemplifying control profiles of the temperature controller in a third lot period, a second lot exchange period, and a fourth lot period in the second period.
Figure 6C:
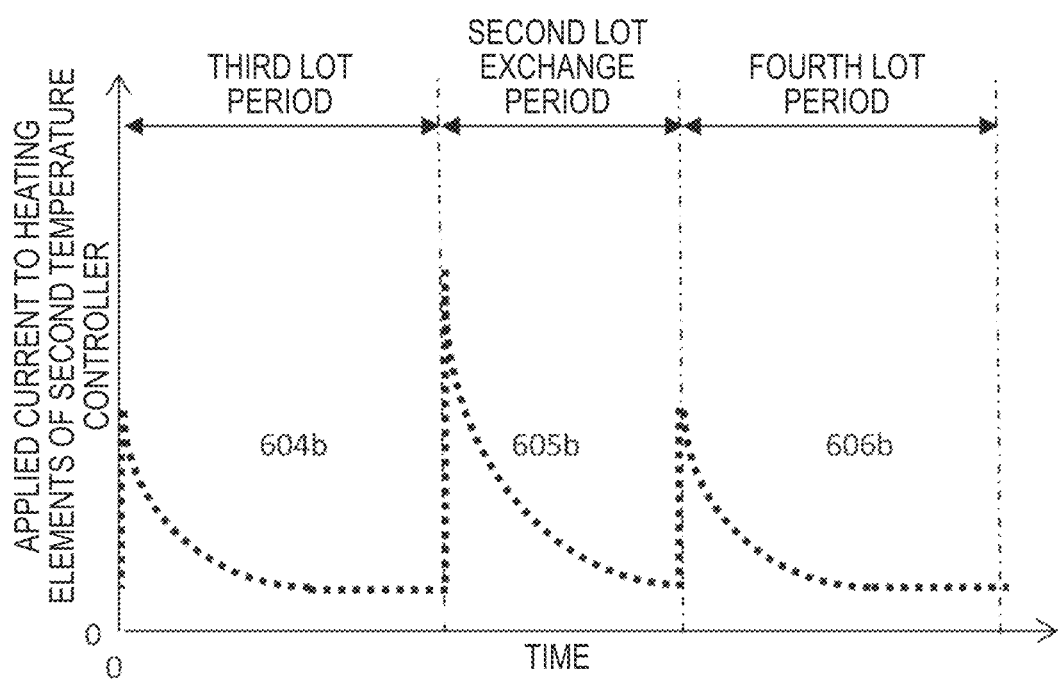

FIG. 6C shows a control example of current application to each heating element of the first temperature controller 204 and each heating element of the second temperature controller 203 in the third lot period, the fourth lot period, and the second lot exchange period in the second period in which the second reticle is used. First, the third lot period will be described. The light intensity distribution formed on the optical element 111, which is near the reticle, in the projection optical system 107 by the slit-shaped exposure light extending in the X direction can generate positive astigmatism. This is similar to the first period in which the first reticle is used. On the other hand, the main pattern of the second reticle is the LS pattern PH arrayed in the Y direction, and a diffracted light distribution is generated on or near the pupil plane of the projection optical system 107 in the Y direction as shown in the hatched portion 504 of FIG. 5D. As a result, a temperature distribution as shown in the hatched portion 506 of FIG. 5F is generated on the optical element 109 arranged on or near the pupil plane of the projection optical system 107, and negative astigmatism can be generated in the projection optical system 107. This is the point that is different from the first period in which the first reticle is used.

In the first period, control can be performed to reduce the change in the positive astigmatism of the projection optical system 107 which is caused by both the slit-shaped exposure light extending in the X direction and the diffracted light distribution generated by the first reticle in the X direction. More specifically, in the first period, control can be performed to generate negative astigmatism in the projection optical system 107 by applying a current to the heating elements 204a and 204b of the first temperature controller 204. In the second period, the exposure operation can cause positive astigmatism to be generated by the heat distribution of the slit-shaped exposure light extending in the X direction and negative astigmatism to be generated by the diffracted light distribution in the Y direction by the second reticle. The current to be applied to each heating element of the first temperature controller 204 and each heating element of the second temperature controller 203 can be controlled in consideration of two factors. The first factor is the positive astigmatism generated in the projection optical system 107 by the temperature distribution generated on the optical element 111, which is near the reticle, of the projection optical system 107 by the slit-shaped exposure light extending in the X direction. The second factor is the negative astigmatism generated in the temperature distribution generated on the optical element 109, which is near the pupil plane of the projection optical system 107, by the diffracted light distribution in the Y direction generated by the reticle pattern of the second reticle. The sign and the magnitude of the overall astigmatism of the projection optical system 107 are determined by the degree of contribution (degree of influence) of the first factor and the second factor.

Assume here that the degree of contribution of the negative astigmatism (the second factor) by the temperature distribution generated on the optical element 109 by the diffracted light from the second reticle pattern of the projection optical system 107 is greater than that of the other (first factor). A current 604a applied to the heating elements 204a and 204b of the first temperature controller 204 and a current 604b applied to the heating elements 203a and 203b of the second temperature controller 203 in this case are exemplified in FIG. 6C. In the third lot period, the current, as shown as the current 604a, is not applied to the heating elements 204a and 204b of the first temperature controller 204. On the other hand, the second temperature controller 203 can reduce the change in the negative astigmatism by the temperature distribution generated on the optical element 109, arranged on or near the pupil plane of the projection optical system 107, by the diffracted light distribution from the pattern of the second reticle. This is implemented by generating positive astigmatism in the projection optical system 107 by applying a current to the heating elements 203a and 203b of the second temperature controller 203. The main control system 100 can make the change in the astigmatism of the projection optical system 107, which is generated by the current applied to the heating elements of the second temperature controller 203, follow the change in the astigmatism of the projection optical system 107 generated by the absorption of the exposure light by the optical element 111 and the optical element 109. This can be implemented by gradually reducing the current 604b which is applied to the heating elements of the second temperature controller 203 in accordance with the elapse of time from the start of the third lot period.

Control performed in the application of a current to each heating element of the first temperature controller 204 and each heating element of the second temperature controller 203 in the second lot exchange period between the third lot period and the fourth lot period in the second period in which the second reticle is used will be described next. In the second lot exchange period in which the projection optical system 107 is not irradiated with the exposure light, the heat dissipation from the optical element 109 of the projection optical system 107 will start and the temperature of the optical element 109 can decrease. Hence, both the first temperature controller 204 and the second temperature controller 203 can be controlled so as to minimize, as much as possible, the change in the temperature distribution of the optical element 109 that occurs immediately after the end of the third lot period. For example, a current, as a current 605a, which is greater than the current applied at the end of the third lot period can be applied to the heating elements 204a and 204b of the first temperature controller 204 at the start of the second lot exchange period. This is because compensation of the heat from the exposure light that was absorbed by the optical element 109 during the third lot period will be difficult if a current of the same magnitude as the current applied at the end of the third lot period is applied. To reduce the change in the temperature distribution on the optical element 109 caused by the diffracted light distribution from the second reticle which was present in the third lot period becoming absent in the second lot exchange period, the first temperature controller 204 applies a current, as the current 605a, from the start of the second lot exchange period. The main control system 100 can gradually reduce the current applied to each heating element of the first temperature controller 204 and each heating element of the second temperature controller 203 in accordance with the elapse of time from the start of the second lot exchange period. As a result, it will be possible to suppress, while suppressing the change in the temperature distribution on the optical element 109, the change in the astigmatism of the projection optical system 107 that can be generated by the heating of the optical element 109 by the heating elements 204a, 204b, 203a, and 203b. To suppress the heat dissipation and the change in the astigmatism that accompanies the heat dissipation, due to the lack of exposure light irradiation, in each optical element of the projection optical system 107, it is preferable to set the second lot exchange period to be as short as possible.

The control performed in the application of a current to each heating element of the first temperature controller 204 and each heating element of the second temperature controller 203 in the fourth lot period after the second lot exchange period in the second period in which the second reticle is used will be described. Since the exposure operation will be restarted immediately after the start of the fourth lot period, the temperature distribution that causes negative astigmatism to be generated in the projection optical system 107, due to the influence of a diffracted light distribution in the Y direction dependent on the pattern of the second reticle, will be generated mainly on or near the pupil plane of the projection optical system 107 in a manner similar to the third lot period. Hence, to generate astigmatism in the opposite direction, a current 606b is applied to the heating elements 203a and 203b of the second temperature controller 203 from the start of the fourth lot period. However, the current 606b can be set smaller than a current 605b which is applied to the heating elements 203a and 203b of the second temperature controller 203 to suppress the heat dissipation due to exposure light irradiation being stopped in the second lot exchange period. Also, the optical element 109 of the projection optical system 107 will start to absorb the exposure light again from immediately after the start of the fourth lot period. Hence, the application of a current, as shown as a current 606a, to the heating elements 204a and 204b of the first temperature controller 204 performed to suppress the heat dissipation due to the stop of exposure light irradiation during the second lot exchange period can be stopped. The main control system 100 can gradually reduce the current 606b applied to the heating elements 203a and 203b of the second temperature controller 203 in accordance with the elapse of time from the start of the fourth lot period. The control performed in the application of a current to each heating element of the first temperature controller 204 and each heating element of the second temperature controller 203 in the fourth lot period can be similar to that performed in the third lot period.

Figure 6D:
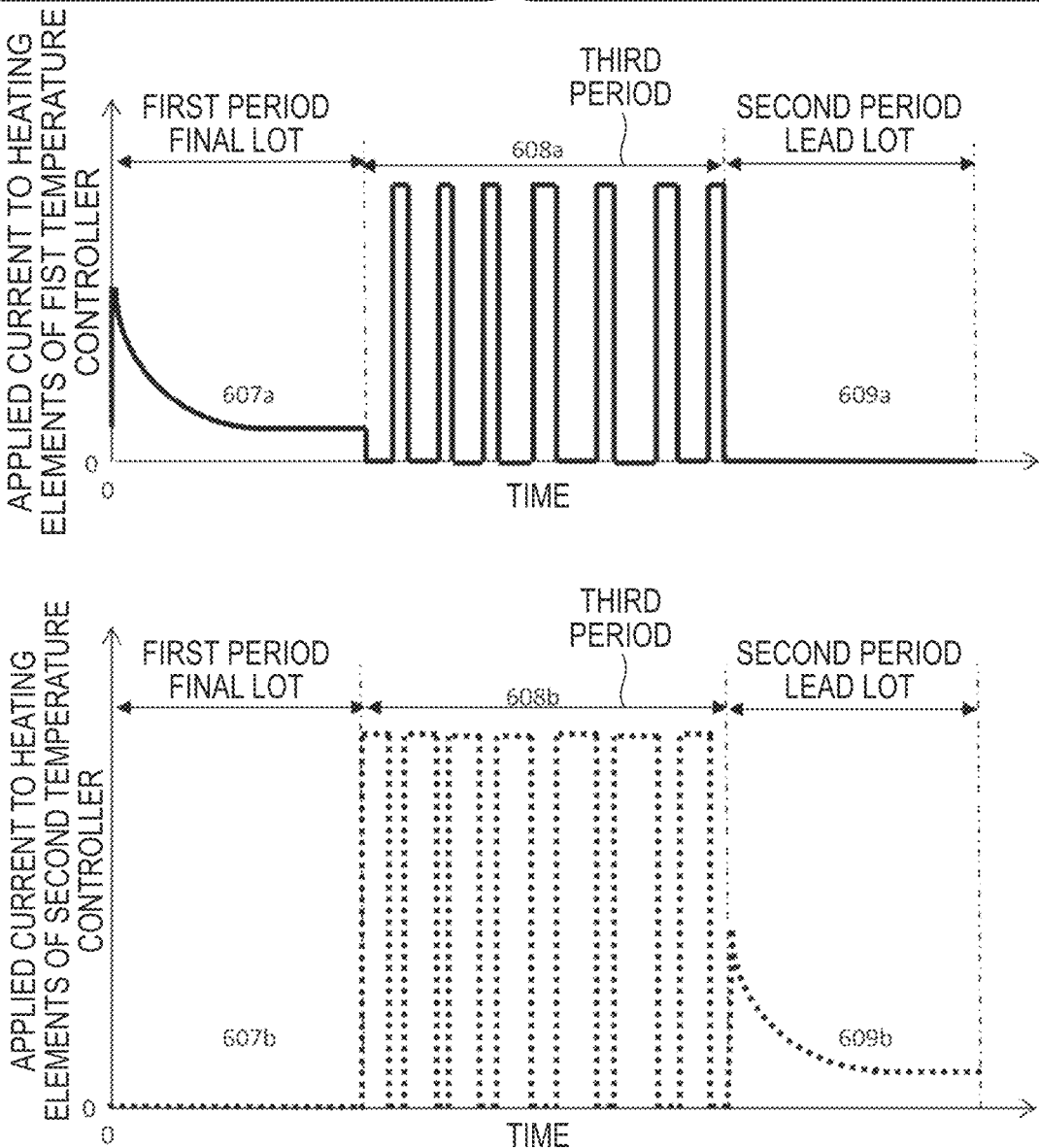
FIG. 6D is a view exemplifying control profiles of the temperature controller in the first period, the second period, and the third period.

FIG. 6D shows an example of control performed in the application of a current to each heating element of the first temperature controller 204 and each heating element of the second temperature controller 203 in the third period, in which the reticles are exchanged, between the final lot of the first period in which the first reticle is used and the first lot of the second period in which the second reticle is used. A current 607a of the heating elements 204a and 204b of the first temperature controller 204 and a current 607b of the heating elements 203a and 203b of the second temperature controller 203 applied in the final lot of the first period can be similar to the currents 601a and 601b, respectively, of the first lot period. A current 609a of the heating elements 204a and 204b of the first temperature controller 204 and a current 609b of the heating elements 203a and 203b of the second temperature controller 203 applied in first lot of the second period can be similar to the currents 604a and 604b, respectively, of the third lot period.

In the reticle exchange period, the temperature of the optical element 109 will decrease because heat will dissipate from the optical element 109 of the projection optical system 107 due to the absence of exposure light irradiation in a manner similar to the first lot exchange period and the second lot exchange period. Hence, it is preferable to control both the first temperature controller 204 and the second temperature controller 203 so the temperature distribution of the optical element 109 obtained immediately after the end of the immediately preceding lot will not change as much as possible. However, the control of the first temperature controller 204 and the second temperature controller 203 performed in the final lot of the first period differs from that performed in the first lot of the second period.

For example, a current 608a applied to the heating elements of the first temperature controller 204 in the reticle exchange period can be set to be substantially equal to that at the end of the final lot of the first period to suppress the change in the temperature distribution of the optical element 109 of the projection optical system 107. However, when an exposure operation is started in the first lot of the second period, the application of the current to the heating elements of the first temperature controller 204 can be stopped. Hence, the current applied to the heating elements of the first temperature controller 204 during the reticle exchange period can be controlled so the amount of heat applied to the optical element 109 will not be excessive. In a similar manner, the application of a current 608b to the heating elements of the second temperature controller 203 in the reticle exchange period will be started at the end of the final lot of the first period to suppress the change in the temperature distribution of the optical element 109 of the projection optical system 107. However, since the application of the current to the heating elements of the second temperature controller 203 will be continued when the exposure is started in the first lot of the second period, the current of the first temperature controller 204 in the reticle exchange period can be set so the amount of heat applied to the optical element 109 will not be excessive. In addition, in the third period accompanied by the exchanging of the reticles, the amount of heat applied to the optical element 109 can be controlled so as not to be too small.

To suppress the change in the temperature distribution and the change in the astigmatism accompanying this change caused by the heat dissipation of the optical element 109 of the projection optical system 107 due to the absence of exposure light irradiation, it is preferable to make the length of the third period, which includes the exchanging of the reticles, to be short as possible. There can be a temporal lag between the supplying of the current to the heating elements of the first temperature controller 204 and the second temperature controller 203 and the change in the temperature distribution of the optical element 109 due to the supplying. Also, it will be difficult to suppress the influence of the change in the temperature distribution of each optical element of the projection optical system 107, which has occurred due to the absence of exposure light irradiation over a long time, by only using the first temperature controller 204 and the second temperature controller 203 to control the temperature distribution of the optical element 109.

The third period can be implemented by the lot schedule management executed by the host computer 150. For example, the host computer 150 can control the start timing of each of the m lots (m≥2) in which the first reticle is used and the n lots (n≥2) in which the second reticle is used. The host computer 150 can schedule each lot so that the time difference, that is, the third period, between the final lot using the first reticle (the final lot of the first period) and the first lot using the second reticle (the first lot of the second period) will be shorter than a predetermined reference. Mounting the second reticle in a preset position (for example, a reticle position of the reticle conveyance system where a rotation mechanism can rotate by 180° to allow a reticle to be exchanged with the reticle on the reticle stage RS) in advance is advantageous for shortening the third period. In addition, the third period can be shortened effectively by starting an inspection operation for a foreign object on the second reticle before the end of the first period, such as at the time of exposure of the final lot of the first period, instead of starting the inspection operation after the end of the first period. It is preferable for the third period to be shorter than the first period that immediately precedes the third period. It is preferable for the time from the end of the exposure of the final shot region of the final substrate (of the final lot) of the first period to the start of the exposure of the first shot region of the first substrate (of the first lot) of the second period to be no longer than 2 min.

Due to the reasons described above, control can be executed more finely in the third period, which is accompanied by the exchanging of the reticles, than in the first lot exchange period and the second lot period so that the thermal energy applied to the optical element 109 by the first temperature controller 204 and the second temperature controller 203 will not be excessive or insufficient. In addition, it is preferable for the third period, which is accompanied by the exchanging of the reticles, to be set short, and there can be a temporal difference between the supplying of a current to each heating element and the change in the temperature of the optical element 109. Hence, for example, in the supplying of the current 608a in the first temperature controller 204 and the supplying of the current 608b in the second temperature controller 203, it can be effective to repeatedly apply, for a predetermined time, a current of a constant value to the first temperature controller 204 and the second temperature controller 203 alternately or simultaneously in the third period as shown in FIG. 6D.

The above embodiment described an example in which the LS pattern PV arrayed in the X direction is the main pattern of the reticle to be used in the first period, the LS pattern PH arrayed in the Y direction is the main pattern of the reticle to be used in the second period, and the aperture ratios of these patterns are substantially equal to each other. For example, in a case in which a hole pattern for DRAM plug formation is arranged substantially uniformly without shifting in the X direction or the Y direction in the reticle that is used in the second period, the aperture ratio of the pattern region of the reticle can differ greatly from that of the reticle with an LS pattern. For example, while the aperture ratio of an LS pattern can typically be about a few ten percent, the aperture ratio of the hole pattern can typically be about a few percent. Also, in relation to the illumination mode of the illumination optical system, small σ illumination is generally used to increase the image contrast, and the influence from the small σ illumination can cause an aberration to manifest more easily in the projection optical system 107. Note that σ indicates the ratio between the NA of the illumination optical system and the NA of the projection optical system, and small σ illumination is illumination in which the diameter of the exposure light that passes through the pupil plane of the illumination optical system is smaller than that of the exposure light used in normal illumination.

If astigmatism is controlled (corrected) insufficiently in a case in which a reticle for the hole pattern is to be used in the second period, the hole pattern can be transferred in an elliptical shape with different lengths in the X direction and the Y direction, and a defect can be generated during the embedding of a plug material or the like that follows the etching process thereafter. In a case in which the reticle for the LS pattern PV is to be used in the first period, a diffracted light distribution in the X direction can be generated on or near the pupil plane of the projection optical system 107. On the other hand, in a case in which the reticle for the hole pattern is to be used in the second period, a diffracted light distribution is generated with little polarization in the X direction or the Y direction. Hence, although temperature control in the second period can be performed differently from that in the first period in which the LS pattern PV is used, it is desirable to shorten the length of the third period as much as possible to suppress the change in the astigmatism due to the change in the temperature distribution of the optical element 109.

The temperature regulator 108 can use a temperature sensor (not shown) to detect the temperature or the temperature distribution of the optical element 109, and adjust the temperature distribution of the optical element 109 based on the detected temperature or temperature distribution. The temperature regulator 108 can control the supplying of the current to the heating elements 203a, 203b, 204a, and 204b to control the temperature distribution of the optical element 109 so as to reduce the change in the astigmatism in the projection optical system 107.

The temperature regulator 108 that adjusts the temperature distribution of the optical element 109 may adjust the temperature distribution of the optical element 109 by performing infrared irradiation on the optical element 109 instead of using a heat generating element such as a thermoelectric element or the like. Alternatively, the temperature distribution of the optical element 109 can be adjusted by adjusting the light intensity distribution of the pupil of the illumination optical system 104. Particularly, in a case in which the numerical aperture (NA) of the illumination optical system 104 is relatively small (for example, NA=0.6 or less), the controllability of the temperature regulator 108 with respect to the optical element 109, arranged on or near the pupil plane of the projection optical system 107, can degrade compared to a case in which the NA is relatively large. In such a case, the optical element 109 may be heated by using exposure light that does not contribute to the image formation of the reticle pattern.

The wavelength of light generated by the light source 102 of the exposure apparatus EXP can fall within a range of 100 nm or more to 300 nm or less, and can be, for example, 248 nm or 193 nm but may also be of another wavelength. Since the influence of the heat applied to the projection optical system 107 will increase as the wavelength of the exposure light decreases, it becomes important to control the astigmatism. Hence, the effect of the control can appear more conspicuously in a case in which the wavelength falls within a range of 100 nm or more to less than 225 nm than in a case in which the wavelength falls within a range of 225 nm or more to less than 300 nm. In this case, the wavelength of a mercury lamp light source (I-line) is 365 nm. The wavelength of light generated by a KrF excimer laser light source is 247 nm. The wavelength of light generated by an ArF excimer laser light source is 193 nm. The wavelength of light generated by an F2 laser light source is 157 nm. The wavelength of light generated by a Kr2 laser light source is 146 nm. The wavelength of light generated by an Ar2 laser light source is 126 nm. A harmonic generation light source for a YAG laser, a harmonic generator for a solid-state laser (semiconductor laser or the like), or the like can also be used. The exposure apparatus can be an immersion exposure apparatus.

The above embodiment described an example of a reticle pattern of a semiconductor memory DRAM as a semiconductor storage device. However, the present invention is also applicable to other semiconductor devices such as the reticle pattern (vertical wiring lines for reading out pixel signal from a pixel circuit, horizontal wiring lines for driving the pixel circuit, a contact hole, and the like) of an image sensor (image sensing device) such as a CMOS or a CCD, and the like. In addition, the present invention is also applicable to other semiconductor devices such as the reticle pattern (vertical wiring lines for writing pixel signals in a pixel circuit, horizontal wiring lines for driving the pixel circuit, a contact hole, and the like) of a display (display device) such as an OLED or an LCD, and the like.

There is a method that forms a resist pattern by dividing a single image sensing region of an image sensor into a plurality of partial regions, forming a latent pattern on the entire image sensing region by performing individual exposure operation on each of the plurality of partial regions, and subsequently developing the latent pattern. Note that a latent pattern is a pre-development pattern formed by an exposure operation on a photoresist film of a substrate. Such an exposure method can be referred to as divided exposure. In divided exposure, one partial region of the image sensing region can be exposed in the first period, and another partial region of the image sensing region can be exposed in the second period. In this case, a plurality of substrates to be exposed in the first period and a plurality of substrates to be exposed in the second period can be the same. From a wider point of view, at least one substrate of the plurality of substrates to be exposed in the first period and at least one substrate of the plurality of substrates to be exposed in the second period can be the same substrate. In a case in which an image sensor is to be manufactured by divided exposure, it will be preferable for the characteristics of the plurality of partial regions to be equal to each other. Shortening the length of the third period is advantageous in making the influence from the aberration of the projection optical system to be common for the plurality of partial regions and for equalizing the characteristics of the plurality of partial regions. Divided exposure can also be effective in a display device or the like.

Among the semiconductor devices manufactured by a manufacturing method according to the above-described embodiment, a good performance and a good yield can be implemented in a semiconductor device that includes a substrate exposed by using the second reticle because a change in the aberration of the projection optical system will be suppressed. Although an operation performed to be before the first period has not been illustrated in the above-described embodiment, the operation to be performed before the first period may also be considered. For example, a preliminary period may be set before the first period, and a dummy exposure operation using the first reticle may be performed in the preliminary period. The length of the preliminary period can be, for example, a length that falls within a range of 50% or more to 130% or less of the third period. However, from the point of view of increasing the operating ratio of the exposure apparatus ES, it is preferable to set the length of the preliminary period to be a length that falls within the range of 50% or more to 130% or less of the third period. The dummy exposure operation can be an operation to expose a dummy substrate which is not a substrate to be used for manufacturing a semiconductor device. The use of a dummy substrate can prevent the substrate chuck from degrading due to exposure light irradiation. Since setting a preliminary period will allow the fluctuation of the aberration in the projection optical system 107 that occurs immediately after the start of the first period to be reduced, the fluctuation of the aberration in the projection optical system 107 can be reduced for the entire first period and, furthermore, the entire first and second periods. In this manner, by performing an exposure operation in the preliminary period, it will be possible to implement a good performance and a good yield in a semiconductor device, among the semiconductors manufactured by a manufacturing method according to the above-described embodiment, that includes a substrate exposed by using the first reticle because a change in the aberration of the projection optical system will be suppressed. When the aberration fluctuation is minimized, the controllability of the temperature regulator 108 will improve because the fluctuation in the value of the current applied by the temperature regulator 108 to the heating elements of the first temperature controller 204 and the second temperature controller 203 will also be minimized. The controllability of the current application performed by the temperature regulator 108 on the heating elements may also be improved by predicting, in advance, the range of the aberration fluctuation based on the pattern, the aperture ratio, and the like of the reticle to be used in an exposure apparatus. Therefore, it can be also effective to design the projection optical system 107 of the exposure apparatus so that, for example, control performed in an intermediate value of the aberration fluctuation will be the control performed in the steady state.

The exposure apparatus EXP used in this embodiment may include a mode (non-adjustment mode) in which control for adjusting the temperature distribution of the optical element 109 included in the projection optical system 107 will not be performed. A manufacturer of the semiconductor device may change, in accordance with the manufacturing cost, the throughput, the yield, or the like, the control mode between the non-adjustment mode and an adjustment mode, in which control is performed to adjust the temperature distribution of the optical element 109. In a case in which an exposure operation is to be performed by using the second reticle in the non-adjustment mode after an exposure operation has been performed by using the first reticle, it is preferable to implement a sufficiently long cooling time before the start of the exposure operation by using the second reticle so that the optical element 111 of the projection optical system whose temperature has risen when the exposure operation was performed by using the first reticle can be cooled. Since the accuracy of aberration correction using a means other than the means for adjusting the temperature distribution of the optical element 109 will be low or since the aberration may not be corrected at all in the non-adjustment mode, the aberration can increase in the non-adjustment mode compared to the adjustment mode. If the cooling time is short, the aberration generated when a second reticle is used to perform the exposure operation will increase due to the temperature rise generated in the optical element 111 when the first reticle was used to perform the exposure operation. The sufficiently long cooling time described above should be preferably longer than, for example, the time in which an exposure operation was performed by using the first reticle, that is, a time in which an energy (exposure light) was applied to the optical element 111 when the first reticle was used to perform the exposure operation.

The manufacturer of the semiconductor device may manufacture a semiconductor device by also using, in addition to the exposure apparatus EXP that performs control to adjust the temperature distribution of the optical element 109 as described in the embodiment, an exposure apparatus that does not perform control to adjust the temperature distribution of the optical element 109 as described in the embodiment. The manufacturer of the semiconductor device can appropriately determine what kind of exposure apparatus is to be used to manufacture the semiconductor device. In addition, even if the same exposure apparatus EXP is used, this embodiment need not be applied to all of the reticles and substrates, and a manufacturing method which does not use this embodiment may be used in according to the manufacturing cost, the throughput, the yield, or the like.

The embodiment of the present invention is not limited to the above-described embodiment, and various changes and modifications can be made. For example, an example in which some components of one embodiment have been added to another embodiment or an example in which some components of one embodiment have been substituted by some components of another embodiment can be considered to be an embodiment of the present invention. Note that the disclosed contents of this specification are not limited to those described in this specification, and include all matters graspable from this specification and the drawings accompanying this specification. Furthermore, the disclosed contents of this specification include a complement of each concept described in this specification. That is, for example, even if it is described as "A is greater than B" in this specification, it can be said that this specification discloses that "A is not greater than B" even if the description of "A is not greater than B" has been omitted. This is because a case in which it is described that "A is greater than B" presumes a case in which "A is not greater than B".

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-058312, filed Mar. 27, 2020, which is hereby incorporated by reference herein in its entirety.

What is claimed is:

1. A method of manufacturing a semiconductor device by using an exposure apparatus that includes a reticle stage and a projection optical system, the method including a first period in which a plurality of substrates are exposed by using a first reticle arranged on the reticle stage, a second period in which a plurality of substrates are exposed by using a second reticle arranged on the reticle stage, and a third period which is between the first period and the second period, the method comprising:
 changing, in at least a part of the third period, the first reticle arranged on the reticle stage to the second reticle; and
 performing control, in the first period and the second period, to adjust a temperature distribution of an optical element included in the projection optical system so as to reduce a change in an aberration of the projection optical system,
 wherein the third period is shorter than the first period,
 wherein the first period includes a first lot period in which a substrate of a first lot is exposed by using the first reticle, a second lot period in which a substrate of a second lot is exposed by using the first reticle, and a first intermediate period between the first lot period and the second lot period,
 wherein the projection optical system is not irradiated with exposure light in the first intermediate period, and
 wherein the control includes a third control for reducing the change in the aberration of the projection optical system in the first intermediate period.

2. The method according to claim 1, wherein the control includes a first control for reducing the change in the aberration of the projection optical system which is generated by exposure light irradiation in the first period and a second control for reducing the change in the aberration of the projection optical system which is generated by exposure light irradiation in the second period, and
 wherein a temperature distribution applied to the optical element to reduce the change in the aberration of the projection optical system in the first period and a temperature distribution applied to the optical element to reduce the change in the aberration of the projection optical system in the second period are different from each other.

3. The method according to claim 2, wherein the temperature distribution applied to the optical element by the first control and the temperature distribution applied to the optical element by the second control have opposite phases from each other.

4. The method according to claim 1, wherein an area ratio of a transparent region to a blocking region with respect to the exposure light in a pattern region of the first reticle differs from an area ratio of a transparent region to a blocking region with respect to the exposure light in a pattern region of the second reticle.

5. The method according to claim 1, wherein the first reticle includes a line-and-space pattern formed by lines and spaces arrayed in a first direction, and the second reticle includes a line-and-space pattern formed by lines and spaces arrayed in a second direction which is perpendicular to the first direction.

6. The method according to claim 1, wherein a temperature distribution is applied to the optical element by a first heating element in the first period and the second period, and a temperature distribution is applied to the optical element by a second heating element different from the first heating element in the first intermediate period.

7. The method according to claim 1, wherein the second period includes a third lot period in which a substrate of a third lot is exposed by using the second reticle, a fourth lot period in which a substrate of a fourth lot is exposed by using the second reticle, and a second intermediate period between the third lot period and the fourth lot period,
 wherein the projection optical system is not irradiated with the exposure light in the second intermediate period, and
 wherein the control includes a fourth control for reducing the change in the aberration of the projection optical system in the second intermediate period.

8. The method according to claim 7, wherein a temperature distribution is applied to the optical element by a first heating element in the first lot period and the second lot period, and a temperature distribution is applied to the optical element by a second heating element different from the first heating element in the first intermediate period, and
 wherein a temperature distribution is applied to the optical element by the second heating element in the third lot period and the fourth lot period, and a temperature distribution is applied to the optical element by the first heating element in the second intermediate period.

9. The method according to claim 8, wherein a temperature distribution is applied to the optical element by the first heating element and the second heating element in the third period.

10. The method according to claim 1, wherein not less than 200 substrates are exposed by using the first reticle in the first period.

11. The method according to claim 1, wherein the third period is a period from an end of the first period to a start of the second period, and the third period is not longer than 20 min.

12. The method according to claim 1, wherein the first period, the second period, and the third period are managed by a server.

13. The method according to claim 1, wherein the temperature distribution of the optical element is adjusted based on a result obtained by detecting one of a temperature and the temperature distribution of the optical element.

14. The method according to claim 1, wherein the temperature distribution of the optical element is adjusted by heating the optical element by using a heat generating element.

15. The method according to claim 1, wherein the temperature distribution of the optical element is adjusted by irradiating the optical element with infrared rays.

16. The method according to claim 1, wherein the temperature distribution of the optical element is adjusted by adjusting a light intensity distribution on a pupil of an illumination optical system of the exposure apparatus.

17. The method according to claim 1, wherein the projection optical system includes an another optical element which is arranged closer to an object plane of the projection optical system than the optical element, and the aberration of the projection optical system changes when the other optical element generates heat by absorbing a part of the exposure light.

18. The method according to claim 1, wherein a wavelength of the exposure light of the exposure apparatus is less than 225 nm.

19. The method according to claim 1, wherein the semiconductor device includes one of an image sensor, a display, and a memory.

20. The method according to claim 1, wherein the third period is longer than the first intermediate period.

21. The method according to claim 1, wherein the third period is shorter than a period from a start of the first lot period to an end of the second lot period.

22. The method according to claim 1, wherein the third period is shorter than the second lot period.

23. The method according to claim 1, wherein a period from an end of exposure of a final shot region of a final substrate in the first period to a start of exposure of a first shot region of a first substrate in the second period is not longer than 2 min.

24. The method according to claim 1, wherein the first period is not shorter than 40 min.

25. The method according to claim 1, wherein at least one substrate of the plurality of substrates exposed in the first period and at least one substrate of the plurality of substrates exposed in the second period are the same substrate.

26. The method according to claim 1, further including a preliminary period in which a dummy exposure operation is performed before the first period by using the first reticle arranged on the reticle stage.

27. The method according to claim 1, wherein the aberration of the projection optical system is astigmatism.

28. The method according to claim 1, further comprising:
applying a resist on the substrate before the first period.

29. A method of manufacturing a semiconductor device by using an exposure apparatus that includes a reticle stage and a projection optical system, the method including a first period in which a plurality of substrates are exposed by using a first reticle arranged on the reticle stage, a second period in which a plurality of substrates are exposed by using a second reticle arranged on the reticle stage, and a third period which is between the first period and the second period, the method comprising:
changing, in at least a part of the third period, the first reticle arranged on the reticle stage to the second reticle; and
performing control, in the first period and the second period, to adjust a temperature distribution of an optical element included in the projection optical system so as to reduce a change in an aberration of the projection optical system,
wherein the third period is shorter than the first period, and
wherein the third period is longer than a time from a start of exposure of a first shot region of one substrate of the plurality of substrates to be exposed in the first period to an end of exposure of a final shot region of the one substrate.

* * * * *